(12) United States Patent
Kamada et al.

(10) Patent No.: US 9,535,146 B2
(45) Date of Patent: Jan. 3, 2017

(54) MAGNETIC RESONANCE IMAGING APPARATUS AND MAGNETIC RESONANCE IMAGING METHOD

(71) Applicants: Yasuhiro Kamada, Tokyo (JP); Hikaru Hanada, Tokyo (JP); Masahiro Takizawa, Tokyo (JP)

(72) Inventors: Yasuhiro Kamada, Tokyo (JP); Hikaru Hanada, Tokyo (JP); Masahiro Takizawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 365 days.

(21) Appl. No.: 14/240,192

(22) PCT Filed: Sep. 19, 2012

(86) PCT No.: PCT/JP2012/073872
§ 371 (c)(1),
(2) Date: Feb. 21, 2014

(87) PCT Pub. No.: WO2013/047275
PCT Pub. Date: Apr. 4, 2013

(65) Prior Publication Data
US 2014/0197835 A1    Jul. 17, 2014

(30) Foreign Application Priority Data
Sep. 29, 2011    (JP) ................. 2011-214936

(51) Int. Cl.
G01R 33/48    (2006.01)
G01R 33/56    (2006.01)
G01R 33/561    (2006.01)

(52) U.S. Cl.
CPC ......... *G01R 33/482* (2013.01); *G01R 33/4824* (2013.01); *G01R 33/5608* (2013.01); *G01R 33/5611* (2013.01)

(58) Field of Classification Search
CPC .............. G01R 33/482; G01R 33/4824; G01R 33/5608; G01R 33/5611
See application file for complete search history.

(56) References Cited

U.S. PATENT DOCUMENTS 5,036,281 A    7/1991    Li
7,023,207 B1    4/2006    Gaddipati et al.
(Continued)

FOREIGN PATENT DOCUMENTS

JP    6-171    1/1994
JP    6-70910    3/1994
(Continued)

OTHER PUBLICATIONS

International Search Report in PCT/JP2012/073872.

*Primary Examiner* — Gregory H Curran
(74) *Attorney, Agent, or Firm* — Cooper & Dunham LLP

(57) ABSTRACT

In the non-Cartesian measurement, image quality is improved while the advantages of non-Cartesian measurement are maintained. To realize the aforementioned, in the non-Cartesian measurement, artifacts caused by non-uniform data density in k-space are reduced. Therefore, each unit k-space is imaged by an inverse Fourier transform, the field of view of the image is enlarged in a direction in which data density is to be increased, and the image after the enlargement of the field of view is Fourier transformed and gridded as unit k-space that has a small k-space pitch in the direction in which the field of view has been enlarged and has an increased amount of data. This processing is repeated for all blades.

17 Claims, 15 Drawing Sheets

(56) References Cited

U.S. PATENT DOCUMENTS 8,594,766 B2 * 11/2013 Takizawa ............... A61B 5/055
600/415
2006/0232273 A1 10/2006 Takizawa et al.

FOREIGN PATENT DOCUMENTS

| JP | 2002-85376 | 3/2002 |
| JP | 2004-344183 | 12/2004 |
| JP | 2006-223864 | 8/2006 |

* cited by examiner

FIG. 2
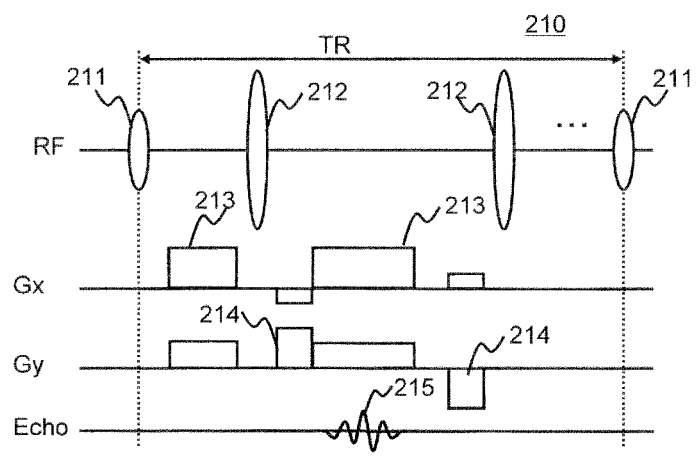
(a)
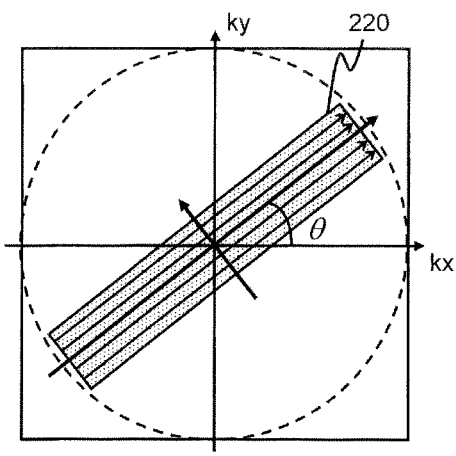
(b)

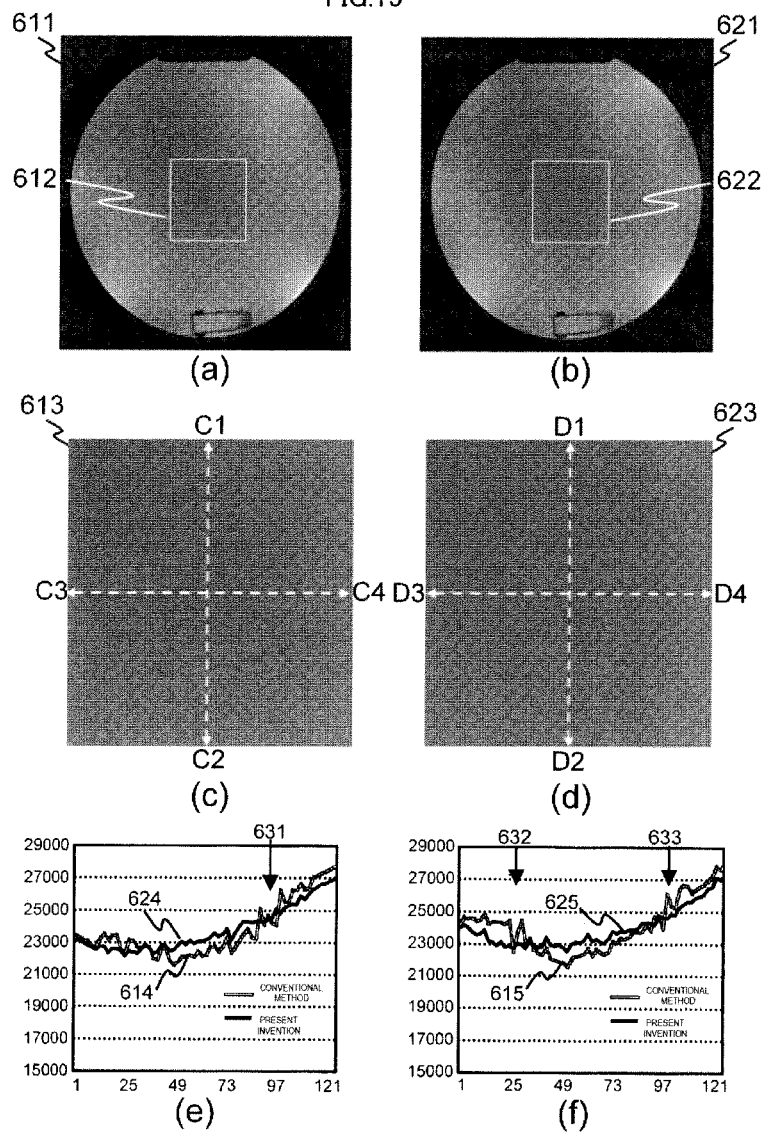

MAGNETIC RESONANCE IMAGING APPARATUS AND MAGNETIC RESONANCE IMAGING METHOD

TECHNICAL FIELD

The present invention relates to a magnetic resonance imaging (hereinafter, referred to as "MRI") technique for measuring a nuclear magnetic resonance (hereinafter, referred to as "NMR") signal from hydrogen, phosphor, or the like in an object and imaging nuclear density distribution, relaxation time distribution, or the like, and in particular, to a non-Cartesian measurement technique.

BACKGROUND ART

An MRI apparatus is an apparatus that measures an NMR signal (echo signal) generated by an object, especially, the nuclear spins that form human tissue, and images the shapes or functions of the head, abdomen, limbs, and the like in a two-dimensional manner or in a three-dimensional manner. In the imaging, different phase encoding and different frequency encoding are given to NMR signals by the gradient magnetic field. The measured NMR signals are reconstructed as an image by a two-dimensional or three-dimensional Fourier transform.

The measured NMR signals are disposed in k-space (data space). In this case, the scanning trajectory of k-space is largely divided into two scanning trajectories of the Cartesian coordinate system and the non-Cartesian coordinate system according to the gradient magnetic field pattern to be applied. The Cartesian coordinate system k-space is data space defined by two or three coordinate axes perpendicular to each other. On the other hand, the non-Cartesian coordinate system k-space is data space defined by the size and the angle of deviation. Hereinafter, a measurement to acquire the scanning trajectory of the Cartesian coordinate system is referred to as a Cartesian measurement, and a measurement to acquire the scanning trajectory of the non-Cartesian coordinate system is referred to as a non-Cartesian measurement.

In the non-Cartesian measurement, k-space of a predetermined unit (unit k-space) is measured while changing the angle of deviation, and is converted into Cartesian coordinate system k-space by interpolation processing called gridding. In this case, since a scan is repeatedly performed near the center of k-space for each unit k-space, the influence of the motion, such as breathing, is averaged. For this reason, in the non-Cartesian measurement result, there is a feature that artifacts in a specific direction due to the movement of an object are not likely to occur.

For the non-Cartesian measurement, there is a method called a hybrid radial method. In measurement using the hybrid radial method, the shape of each unit k-space is generally a rectangle, and is called a blade (for example, refer to NPL 1). By applying the gradient magnetic field under the conditions in which the long axis direction of the blade is a frequency encoding direction and the short axis direction of the blade is a phase encoding direction, an echo signal is acquired.

In the hybrid radial method, in order to obtain a spatial resolution equivalent to the Cartesian measurement, echo signals of $(\pi/2)$ times are required. Accordingly, the measurement time is increased. For this reason, there is a technique of applying parallel imaging to each blade in order to shorten the measurement time (for example, refer to PTL 1 and PTL 2). In this case, in the hybrid radial method, the parallel imaging operation is performed for each blade. Accordingly, since the amount of processing is small compared with so-called general parallel imaging to expand folds having arbitrary shapes, the reconstruction time is also reduced.

CITATION LIST

Patent Literature

[PTL 1] U.S. Pat. No. 7,372,269
[PTL 2] U.S. Pat. No. 7,102,348

Non Patent Literature

[NPL 1] James G. Pipe. "Motion Correction With PROPELLER MRI: Application to Head Motion and Free-Breathing Cardiac Imaging "Magnetic Resonance in Medicine 1999 42 p963-969

SUMMARY OF INVENTION

Technical Problem

Unlike the Cartesian measurement, in the non-Cartesian measurement, k-space is filled by gridding data of a plurality of unit k-spaces. In general, in each unit k-space, a sampling pitch in the frequency encoding direction is different from a sampling pitch in the phase encoding direction. For this reason, data density becomes non-uniform and artifacts are generated. This prevents the improvement in image quality.

The present invention has been made in view of the above situation, and it is an object of the present invention to provide a technique for improving image quality while maintaining the advantages of non-Cartesian measurement.

Solution to Problem

The present invention reduces artifacts, which are caused by non-uniform data density in k-space, in the non-Cartesian measurement. Therefore, each unit k-space is imaged by an inverse Fourier transform, the field of view of the image is enlarged in a direction in which data density is to be increased, and the image after the enlargement of the field of view is Fourier transformed and gridded as unit k-space that has a small k-space pitch in the direction in which the field of view has been enlarged and has an increased amount of data. In addition, this processing is repeated for all blades.

Specifically, there is provided a magnetic resonance imaging apparatus including: a measurement unit that acquires unit k-space data by measuring an echo signal for each unit k-space by non-Cartesian measurement; a correction unit that corrects the unit k-space data to acquire unit k-space data after correction; a rearrangement unit that rearranges the unit k-space data after correction in Cartesian coordinate system k-space; and an imaging unit that reconstructs an image by performing an inverse Fourier transform of data after rearrangement by the rearrangement unit. The correction unit includes a unit imaging section that reconstructs a unit image, which is an image of each unit k-space, from the unit k-space data, a field of view enlargement section that enlarges a field of view of the unit image to acquire an enlarged image, and a unit signaling section that performs a Fourier transform of the enlarged image to acquire unit k-space data after correction.

In addition, there is provided a magnetic resonance imaging method including: a signal measurement step of acquiring unit k-space data by measuring an echo signal for each unit k-space by non-Cartesian measurement; a unit image reconstruction step of reconstructing a unit image, which is an image of each unit k-space, from the unit k-space data; a field of view enlargement step of enlarging a field of view of the unit image to acquire an enlarged image; a unit signaling step of performing a Fourier transform of the enlarged image to acquire unit k-space data after correction; a signal rearrangement step of rearranging the unit k-space data after correction in Cartesian coordinate system k-space; and a final imaging step of reconstructing an image by performing an inverse Fourier transform of data after rearrangement in the signal rearrangement step.

Advantageous Effects of Invention

Image quality is further improved while maintaining the advantages of the non-Cartesian measurement.

BRIEF DESCRIPTION OF DRAWINGS

FIG. 2(a) is an explanatory view for explaining the imaging sequence of non-Cartesian measurement of the third embodiment, and FIG. 2(b) is an explanatory view for explaining unit k-space measured by the imaging sequence shown in FIG. 2(a).

FIG. 7(a) is a final image obtained by the conventional method, FIG. 7(b) is a final image obtained by the method of the first embodiment, FIG. 7(c) is an enlarged diagram of the frame of FIG. 7(a), FIG. 7(d) is an enlarged diagram of the frame of FIG. 7(b), FIG. 7(e) is a brightness profile on the line segment connecting C1 and C2 of FIG. 7(c) and a brightness profile on the line segment connecting D1 and D2 of FIG. 7(d), and FIG. 7(f) is a brightness profile on the line segment connecting C3 and C4 of FIG. 7(c) and a brightness profile on the line segment connecting D3 and D4 of FIG. 7(d).

FIG. 8(a) is k-space data near the center obtained by the conventional method, FIG. 8(b) is k-space data near the center obtained by the method of the first embodiment, FIG. 8(c) is a profile on the line segment connecting A1 and A2 of FIG. 8(a) and a profile on the line segment connecting B1 and B2 of FIG. 8(b), and FIG. 8(d) is a profile on the line segment connecting A3 and A4 of FIG. 8(a) and a profile on the line segment connecting B3 and B4 of FIG. 8(b).

FIG. 15 is an explanatory view for explaining a comparison result between a conventional method and a method of the third embodiment, where FIG. 15(a) is a final image obtained by the conventional method, FIG. 15(b) is a final image obtained by the method of the third embodiment, FIG. 15(c) is an enlarged diagram of the frame of FIG. 15(a), FIG. 15(d) is an enlarged diagram of the frame of FIG. 15(b), FIG. 15(e) is a brightness profile on the line segment connecting C1 and C2 of FIG. 15(c) and a brightness profile on the line segment connecting D1 and D2 of FIG. 15(d), and FIG. 15(f) is a brightness profile on the line segment connecting C3 and C4 of FIG. 15(c) and a brightness profile on the line segment connecting D3 and D4 of FIG. 15(d).

DESCRIPTION OF EMBODIMENTS

<<First Embodiment>>

Figure 1:
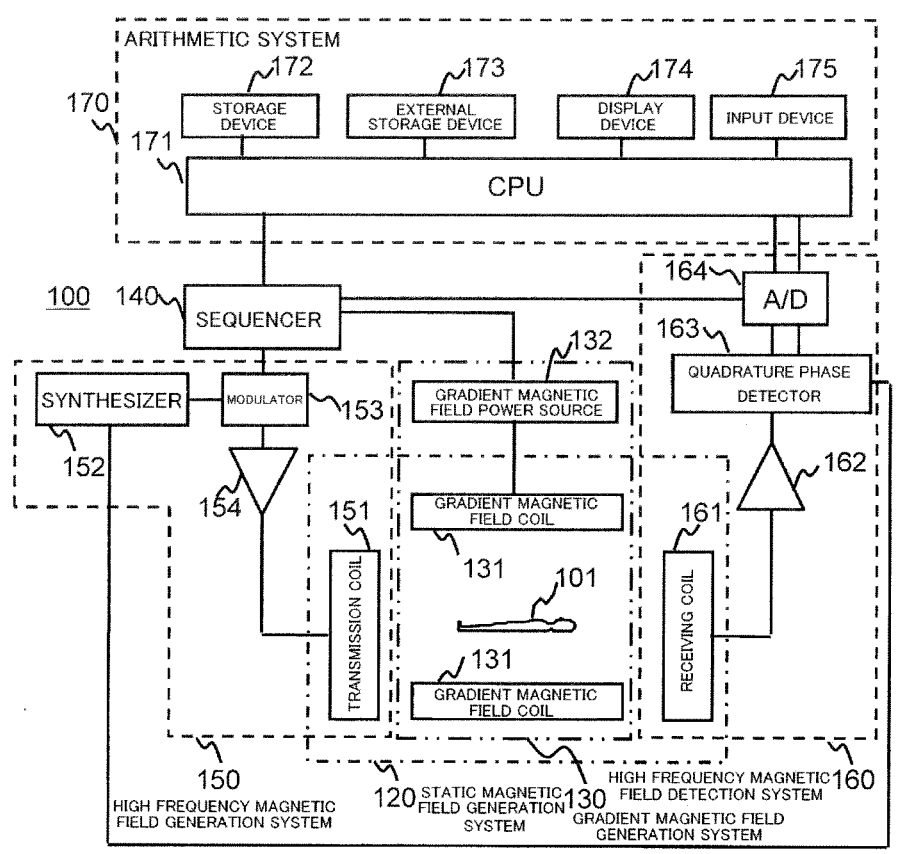
FIG. 1 is a functional block diagram of an MRI apparatus of a first embodiment.

Hereinafter, a first embodiment to which the present invention is applied will be described. Hereinafter, in all diagrams illustrating the embodiments of the present invention, the same reference numerals are given to elements having the same functions, and repeated explanations thereof will be omitted.

First, the outline of an MRI apparatus 100 of the present embodiment will be described with reference to FIG. 1. FIG. 1 is a block diagram showing the overall configuration of the MRI apparatus 100 of the present embodiment. The MRI apparatus 100 of the present embodiment is intended to obtain a tomographic image of an object using an NMR phenomenon, and includes a static magnetic field generation system 120, a gradient magnetic field generation system 130, a sequencer 140, a high frequency magnetic field generation system 150, a high frequency magnetic field detection system 160, and an arithmetic system 170.

The static magnetic field generation system 120 generates a uniform static magnetic field in space around an object 101 in a direction perpendicular to the body axis in the case of a perpendicular magnetic field method and in the body axis direction in the case of a horizontal magnetic field method. A permanent magnet type, normal conduction type, or superconducting type static magnetic field generator is disposed around the object 101.

The gradient magnetic field generation system 130 includes gradient magnetic field coils 131 wound in three axial directions of X, Y, and Z, which are the coordinate system (stationary coordinate system) of the MRI apparatus 100, and a gradient magnetic field power source 132 for driving each of the gradient magnetic field coils 131, and applies gradient magnetic fields in the three axial directions of X, Y, and Z by driving the gradient magnetic field power source 132 of each coil according to an instruction from the sequencer 140, which will be described later. At the time of imaging, a slice-direction gradient magnetic field pulse (Gs) is applied in a direction perpendicular to a slice plane (imaging cross-section) so that a slice plane is set for the object 101, and a phase-encoding-direction gradient magnetic field pulse (Gp) and a frequency-encoding-direction gradient magnetic field pulse (Gf) are applied in two remaining directions, which are perpendicular to the slice plane and are also perpendicular to each other, so that position information in each direction is encoded in an NMR signal (echo signal).

The high frequency magnetic field generation system 150 emits an RF pulse to the object 101 in order to cause nuclear magnetic resonance in the nuclear spins of atoms that form the body tissue of the object 101, and includes a high frequency oscillator (synthesizer) 152, a modulator 153, a high frequency amplifier 154, and a transmission-side high frequency coil (transmission coil) 151. High frequency pulse output from the synthesizer 152 is amplitude-modulated by the modulator 153 at a timing according to the instruction from the sequencer 140, and the amplitude-modulated high frequency pulse is amplified by the high frequency amplifier 154 and is supplied to the transmission coil 151 disposed adjacent to the object 101. As a result, the RF pulse is emitted to the object 101.

The high frequency magnetic field detection system 160 detects an echo signal (NMR signal) emitted by nuclear magnetic resonance of the nuclear spins of atoms, which form the body tissue of the object 101, and includes a receiving-side high frequency coil (receiving coil) 161, a signal amplifier 162, a quadrature phase detector 163, and an A/D converter 164. The echo signal of the response of the object 101 induced by the electromagnetic waves emitted from the transmission coil 151 is detected by the receiving coil 161 disposed adjacent to the object 101 and is amplified by the signal amplifier 162. Then, at a timing according to the instruction from the sequencer 140, the amplified signal is divided into signals of two systems perpendicular to each other by the quadrature phase detector 163, and each signal is converted into a digital amount by the A/D converter 164 and is transmitted to the arithmetic system 170.

The sequencer 140 performs control to apply a high frequency magnetic field pulse (hereinafter, referred to as an "RF pulse") and a gradient magnetic field pulse repeatedly according to a predetermined pulse sequence. The sequencer 140 operates under the control of the arithmetic system 170, and transmits various commands, which are required for data collection of the tomographic image of the object 101, to the gradient magnetic field generation system 130, the high frequency magnetic field generation system 150, and the high frequency magnetic field detection system 160.

The arithmetic system 170 performs various kinds of data processing, display and storage of processing results, and the like, and includes a CPU 171, a storage device 172, an external storage device 173, a display device 174, and an input device 175. For example, a tomographic image of the object 101 is reconstructed using the data from the high frequency magnetic field detection system 160. In addition, a control signal is transmitted to the sequencer 140 according to the imaging sequence. The reconstructed tomographic image is displayed on the display device 174 and is also recorded on the storage device 172 or the external storage device 173. The input device 175 is used when an operator inputs various kinds of control information of the MRI apparatus 100 or control information of processing performed in the arithmetic system 170, and includes a track ball, a mouse, and a keyboard, for example. The input device 175 is disposed adjacent to the display device 174, so that the operator controls various kinds of processing of the MRI apparatus 100 interactively through the input device 175 while viewing the display device 174.

In addition, in FIG. 1, the transmission coil 151 and the gradient magnetic field coils 131 are provided in the static magnetic field space of the static magnetic field generation system 120, in which the object 101 is inserted, so as to face the object 101 in the case of a vertical magnetic field method and so as to surround the object 101 in the case of a horizontal magnetic field method. In addition, the receiving coil 161 is provided so as to face or surround the object 101.

Currently, nuclides imaged by an MRI apparatus, which are widely used clinically, are a hydrogen nucleus (proton) that is a main component material of the object. The shapes or functions of the head, abdomen, limbs, and the like of the human body are imaged in a two-dimensional or three-dimensional manner by imaging information regarding the spatial distribution of the proton density or the spatial distribution of the relaxation time of the excited state.

The imaging sequence by which the CPU 171 of the arithmetic system 170 gives a control signal to the sequencer 140 is determined by a pulse sequence, by which the application timing of the RF pulse and the gradient magnetic field pulse is determined, and a parameter specifying the application strength, application timing, and the like of the RF pulse and the gradient magnetic field pulse. The pulse sequence is set in advance, and is stored in the storage device 172. In addition, parameters are set as imaging conditions through the input device 175 by the operator.

Here, a pulse sequence for realizing the non-Cartesian measurement, which is used in the present embodiment, will be described.

In the present embodiment, a case where a hybrid radial method is used as the pulse sequence for realizing the non-Cartesian measurement will be described as an example.

FIG. 2($a$) is a diagram for explaining an imaging sequence 210 based on the hybrid radial method used in the present embodiment. In addition, FIG. 2($b$) is a diagram for explaining unit k-space (hereinafter, referred to as a blade) 220 of k-space measured (scanned) by the imaging sequence 210. In FIG. 2($a$), axes of RF, Gx, Gy, and Echo indicate an RF pulse, application timing of gradient magnetic field pulses in two axial directions, and acquisition timing of an echo signal, respectively.

The imaging sequence 210 of the present embodiment is a combination of the hybrid radial method and an FSE method. In the FSE method, a plurality of refocusing RF pulses 212 are applied within application time TR from the application of one excitation RF pulse 211 to the application of the next excitation RF pulse 211, and an echo signal 215 is acquired in each application of the refocusing RF pulse 212. In this case, different phase encoding is given to each echo signal 215. In the hybrid radial method, measurement is performed by dividing k-space where the echo signals are disposed into a plurality of unit k-spaces (blades) 220 that are the unit k-spaces (blades) 220 having measurement trajectories passing through the origin of k-space and that have different rotation angles θ, which are angles of the measurement trajectories with respect to the coordinate axis of k-space.

In the imaging sequence 210 used in the present embodiment, measurement inside the unit k-space (blade) 220 shown in FIG. 2($b$), which is a rectangular region including the origin of k-space, is performed within one TR. This is repeated every TR while changing an angle (rotation angle θ) between the blade 220 and the kx axis of k-space, thereby measuring the entire k-space. The waveforms of gradient magnetic field pulses 213 and 214 are determined so as to realize such a k-space scan (measurement).

In addition, the acquired echo signal 215 is imaged after gridding processing. The gridding processing is processing for rearranging data acquired by non-Cartesian measurement at the coordinates (Cartesian coordinate system k-space) of the grid point of k-space. k-space has coordinates of regular grid points. However, since the data acquired by non-Cartesian measurement passes along different trajectories (coordinates) for k-space, the data does not match the grid point coordinates of k-space. In the gridding processing, the pieces of data acquired by non-Cartesian measurement are rearranged at the regular grid point coordinates (Cartesian coordinate system k-space) by interpolation processing. The interpolation processing can be performed using a function for interpolation, such as a Sinc function or a Kaiser-Bessel function.

Hereinafter, imaging processing of the present embodiment for reconstructing an image from the echo signal 215, which is acquired using the above imaging sequence 210, will be described. Prior to the explanation of the imaging processing of the present embodiment, conventional imaging processing will be described with reference to the flow chart of FIG. 3.

Using the imaging sequence 210, the echo signal 215 of one unit k-space (blade) 220 is measured (step S1110), and the acquired echo signal 215 is disposed in k-space according to the blade rotation angle θ. Then, gridding processing is performed (step S1120). Processing of steps S1101 and S1102 is performed for all blades (step S1130). Then, a two-dimensional inverse Fourier transform is performed for all pieces of the acquired k-space data (step S1140), thereby reconstructing an image. Then, when the number of channels is one or more (multi-channel), multi-channel combination to combine the image of each channel is performed (step S1150) at the end. Here, the number of multi-channels is set to an integer of 1 or more.

In the present embodiment, in the non-Cartesian measurement, non-uniformity of data arrangement in k-space is reduced by setting the sampling pitches in x and y directions to be approximately equal while maintaining the advantages of the non-Cartesian measurement. Accordingly, since the non-uniformity of the data density is eliminated, it is possible to reduce artifacts. Reduction of non-uniformity is performed in data of each unit k-space.

Figure 4:
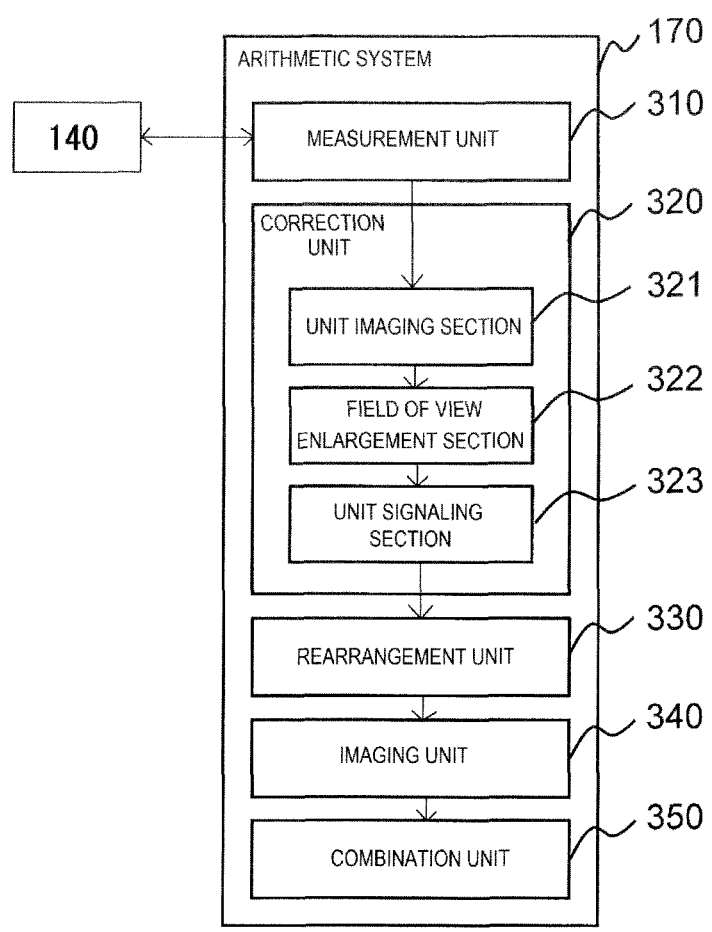
FIG. 4 is a functional block diagram of an arithmetic system of the first embodiment.

In order to realize this, as shown in FIG. 4, the arithmetic system 170 of the present embodiment includes: a measurement unit 310 that acquires an echo signal according to the imaging sequence 210, which is a pulse sequence of non-Cartesian measurement, and arranges the echo signal in k-space to acquire unit k-space data; a correction unit 320 that corrects the unit k-space data acquired by the measurement unit 310 so as to achieve the above-described object and acquires unit k-space data after correction; a rearrangement unit 330 that rearranges the unit k-space data after correction by the correction unit 320 in Cartesian coordinate system k-space; an imaging unit 340 that reconstructs an image from the rearranged data; and a combination unit 350 that combines images of respective channels in the case of a multi-channel.

The function of each unit of the arithmetic system 170 is realized when the CPU loads a program stored in a storage device to the memory and executes it.

The flow of imaging processing by each unit of the arithmetic system 170 of the present embodiment will be described with reference to FIG. 5. In the present embodiment, a case where a multi-channel coil having two or more channels is used as the receiving coil 161 will be described as an example.

In the present embodiment, first, the measurement unit 310 measures an echo signal of one unit k-space (blade) for each channel according to the imaging sequence 210 that is non-Cartesian measurement (step S1210), and the acquired echo signal is disposed in k-space according to the blade rotation angle. Thus, the measurement unit 310 acquires unit k-space data of each channel.

Then, the correction unit 320 performs correction processing for correcting the unit k-space data of each channel (step S1220). By the correction processing, corrected unit k-space data of each channel is acquired. Details of the correction processing will be described later.

Then, the rearrangement unit 330 performs gridding processing on the corrected unit k-space data of each channel (step S1230). The arithmetic system 170 performs the process of steps S1210 to S1230 for all blades (step S1240), thereby acquiring all pieces of k-space data after gridding processing for each channel. Then, the imaging unit 340 performs a two-dimensional inverse Fourier transform on all pieces of k-space data acquired for each channel (step S1250), thereby reconstructing an image (final image) of each channel.

Finally, the combination unit 350 performs multi-channel combination of the final image acquired for each channel (step S1260). In addition, the multi-channel combination may be any of absolute value combination and complex combination. In addition, in the case of complex combination, phase correction for each piece of channel data may be included.

Next, blade correction processing for each channel by the correction unit 320 in the above step S1220 will be described with reference to the diagrams. As shown in FIG. 5, the correction unit 320 of the present embodiment performs correction processing for each blade whenever blade measurement is completed in the non-Cartesian measurement using the imaging sequence 210. For this reason, as shown in FIG. 4, the correction unit 320 of the present embodiment includes a unit imaging section 321 that reconstructs a unit image by performing an inverse Fourier transform of unit k-space data that is an echo signal for each blade, a field of view enlargement section 322 that acquires an enlarged image by enlarging a field of view of the unit image, and a unit signaling section 323 that acquires corrected unit k-space data, which is an echo signal after correction for each blade, by performing a Fourier transform of the enlarged image.

Figure 6:
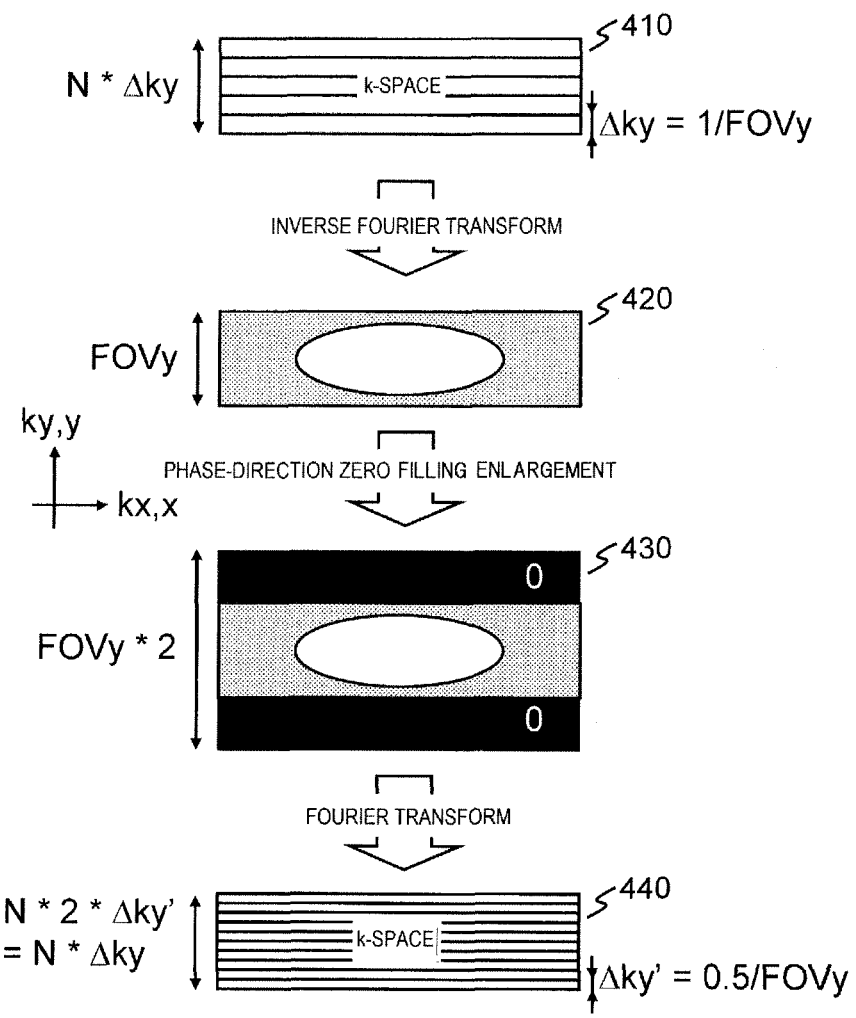
FIG. 6 is an explanatory view for explaining correction processing of the first embodiment.

Here, as shown in FIG. 6, one blade (unit k-space data) 410 will be adopted to explain the correction processing of the correction unit 320 of the present embodiment. The width of the blade 410 in the short axis direction is assumed to be N*Δky. Here, N is an integer of 1 or more indicating the number of phase encoding steps in the blade 410. In addition, Δky is a k-space pitch in the phase encoding direction, and is defined by the following Expression (1).

[Expression 1]

$$\Delta ky = \frac{1}{FOVy} \quad (1)$$

Here, FOVy is a field of view in the phase encoding direction.

In the correction processing of step S1220 described above, first, the unit imaging section 321 performs a two-dimensional inverse Fourier transform of the blade 410 (step S1221), thereby imaging the blade 410. As a result, the unit imaging section 321 acquires a unit image 420 whose field of view in the y direction is FOVy.

Then, the field of view enlargement section 322 enlarges the field of view of the unit image 420 (step S1222), thereby acquiring a unit image 430 after the enlargement of the field of view (enlarged unit image). The field of view is enlarged by adding a predetermined number of pixels, which have a pixel value set in advance, in a direction in which the field of view is to be enlarged. The direction in which the field of view is to be enlarged is a direction in which the k-space pitch is reduced. In the present embodiment, it is assumed that the field of view is enlarged in a ky direction as the phase encoding direction. In the present embodiment, therefore, pixels having a pixel value set in advance are added to both ends of the unit image 420 in the y direction. FIG. 6 illustrates a case where zero is used as a pixel value set in advance, that is, a case where the field of view is enlarged by zero filling in a phase direction.

In addition, the pixel value of the pixel that is added is not limited to zero. For example, a pixel value of a pixel of the unit image 420 adjacent to the addition region may also be used. In addition, when the value of the background noise of the unit image 420 is known in advance, the value may be used.

In addition, the field of view magnification is determined so as to increase the density in the ky direction (phase encoding direction).

Preferably, the field of view magnification is determined so that the pitch in the kx direction and the pitch in the ky direction match each other and accordingly the non-uniformity of the data density is eliminated. FIG. 6 illustrates a case where the field of view is doubled by adding ½ of FOVy to each of both sides in the y direction. That is, this is a case where the field of view magnification is set to 2. Therefore, in the example shown in FIG. 6, the field of view in the phase encoding direction is enlarged from FOVy to FOVy*2 by field of view enlargement processing of the field of view enlargement section 322.

Then, the unit signaling section 323 performs a two-dimensional Fourier transform of the enlarged unit image 430 that is a unit image after the enlargement of the field of view (step S1223), thereby acquiring a corrected blade 440 that is k-space data after correction. The number of phase encoding steps of the corrected blade 440 is increased from N to N*2.

On the other hand, the k-space pitch in the phase encoding direction is reduced from Δky to Δky'. In addition, Δky' is defined by the following Expression (2).

[Expression 2]

$$\Delta ky' = \frac{1}{FOVy \times 2} = 0.5 \Delta ky \qquad (2)$$

As expressed as in Expression (2), the width of the corrected blade 440 in the short axis direction is N*Δky (=N*2*Δky'). Accordingly, the width of the corrected blade 440 in the short axis direction is the same as the width of the blade 410 before the correction in the short axis direction.

Thus, for the blade 410, the number of phase encoding steps in the blade is increased by performing the correction processing of the present embodiment, but the k-space pitch in the phase encoding direction is reduced in inverse proportion to the increase in the number of phase encoding steps. Therefore, the width in the short axis direction (phase encoding direction) in k-space is not changed, but the pitch in the same direction is increased.

In addition, although the present embodiment has been described on the assumption that the field of view magnification in the phase encoding direction is 2 for the sake of convenience, the field of view magnification may be 1 or more or may be a decimal. In addition, when the field of view magnification is set to n (n is an integer of 1 or more) and correction processing of the present embodiment is performed on the blade 410 to enlarge the field of view in the phase encoding direction n times, the number of phase encoding steps in the corrected blade 440 is increased n times. On the other hand, the k-space pitch Δky' in the phase encoding direction of the corrected blade 440 becomes (1/n) times the k-space pitch Δky in the phase encoding direction of the blade 410 before correction as expressed in the following Expression (3).

[Expression 3]

$$\Delta ky' = \frac{1}{FOVy \times n} = \frac{1}{n} \Delta ky \qquad (3)$$

Figure 3:
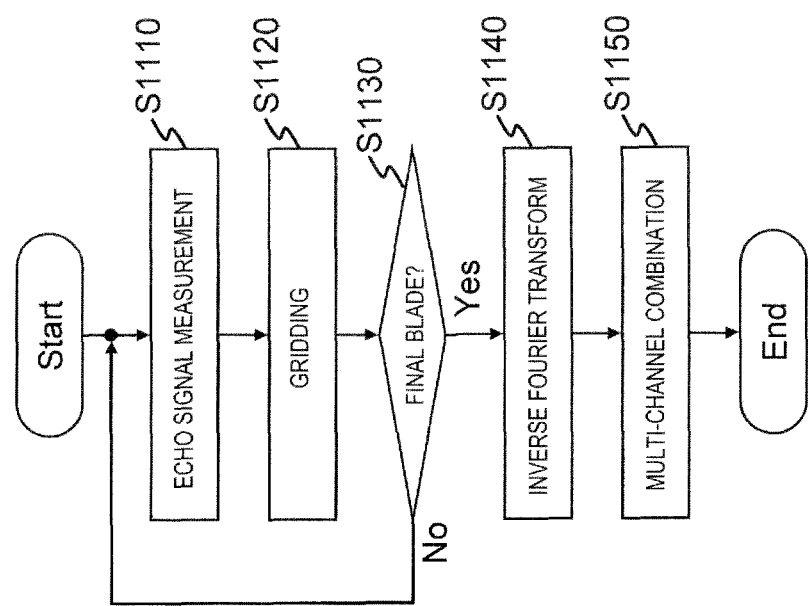
FIG. 3 is a flow chart of imaging processing based on conventional non-Cartesian measurement.

Thus, in the present embodiment, correction processing is added to the imaging processing of the conventional non-Cartesian measurement shown in FIG. 3.

In addition, although a technique called zero filling is used in the correction processing of the present embodiment, the fact that this is performed on an image formed by performing an inverse Fourier transform of k-space data is important. In terms of zero filling processing, a technique of so-called zero filling reconstruction is known in which an inverse Fourier transform is performed after zero filling in a high frequency region of k-space. However, the known zero filling reconstruction is performed in k-space, and is a technique for improving the apparent spatial resolution of an image acquired by the inverse Fourier transform. Therefore, the known zero filling reconstruction technique is different from the technique of the present embodiment in which zero filling is performed on an image to acquire the uniform data density in the non-Cartesian measurement.

Figure 5:
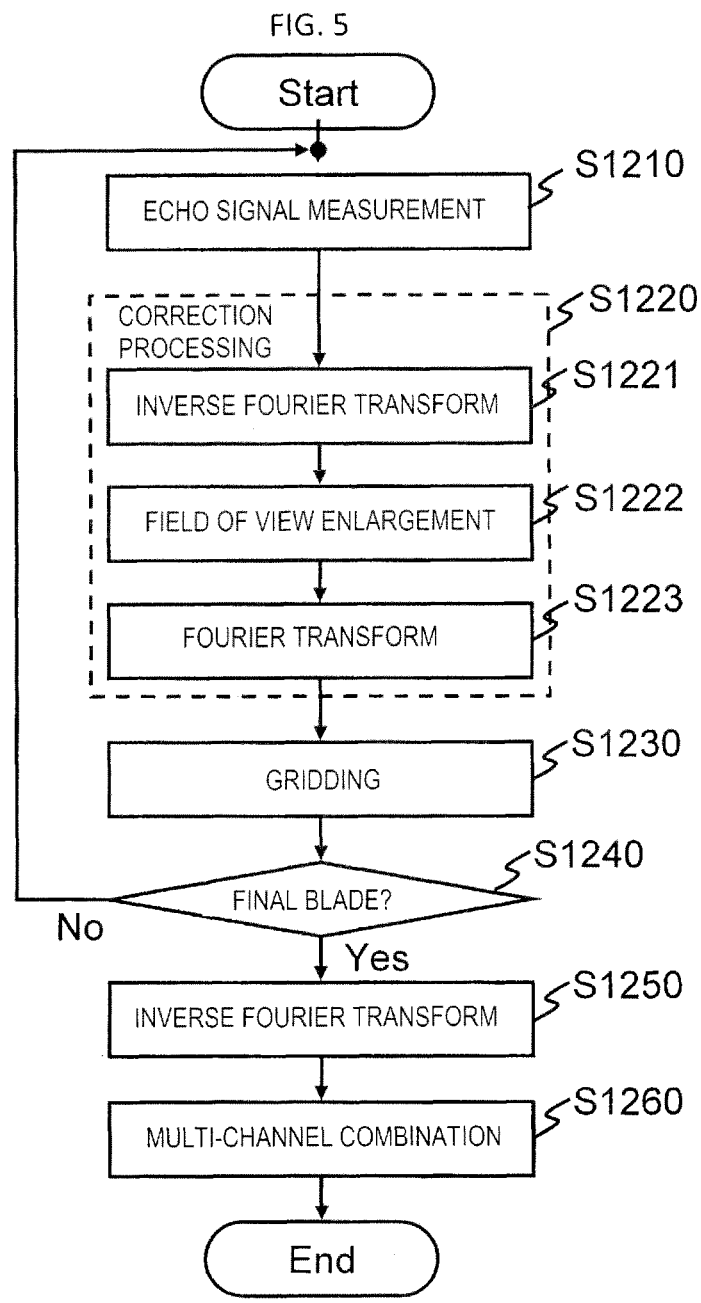
FIG. 5 is a flow chart of imaging processing of the first embodiment.
Figure 7:
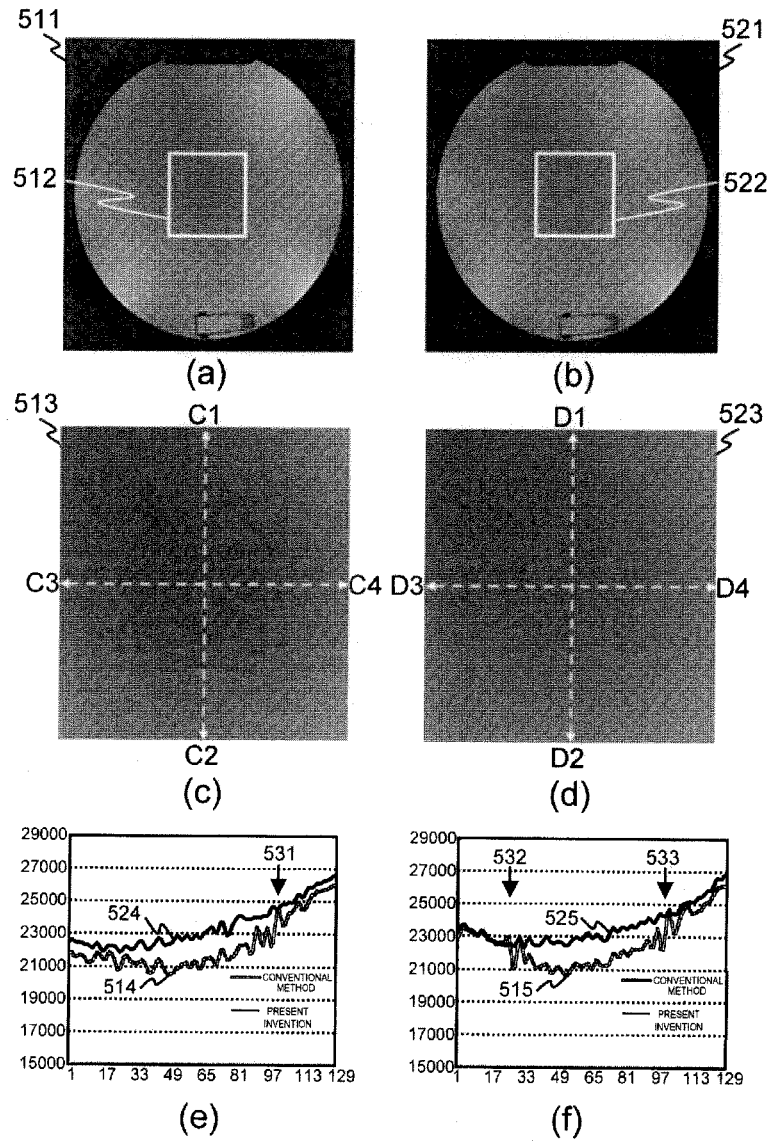
FIG. 7 is an explanatory view for explaining a comparison result between a conventional method and a method of the first embodiment, where

Hereinafter, in order to show the effect of the correction processing of the present embodiment, a comparison result between a final image obtained by imaging processing based on the conventional method shown in FIG. 3 and a final image obtained by imaging processing including the correction processing of the present embodiment shown in FIG. 5 is shown in FIG. 7.

FIG. 7(a) is a final image 511 obtained by the conventional method, FIG. 7(b) is a final image 521 obtained by performing the correction processing of the present embodiment, FIG. 7(c) is an image 513 obtained by enlarging a central portion (frame) 512 of FIG. 7(a), FIG. 7(d) is an image 523 obtained by enlarging a central portion (frame) 522 of FIG. 7(b), and FIG. 7(e) is a brightness profile 514 on the line segment connecting C1 and C2 of FIG. 7(c) and a brightness profile 524 on the line segment connecting D1 and D2 of FIG. 7(d). In addition, FIG. 7(f) is a brightness profile 515 on the line segment connecting C3 and C4 of FIG. 7(c) and a brightness profile 525 on the line segment connecting D3 and D4 of FIG. 7(d). In FIGS. 7(e) and 7(f), the horizontal axis indicates a position in a pixel [pixel], and the vertical axis indicates a pixel value.

As can be seen from the aforementioned diagrams, artifacts are caused in the final images 511 and 513 obtained by the conventional method, but the artifacts have disappeared due to the correction processing of the present embodiment.

In particular, in the brightness profiles 514, 524, 515, and 525 shown in FIGS. 7(e) and 7(f), it can be seen that especially artifacts are reduced and the brightness profiles are smooth at positions indicated by arrows 531, 532, and 533 in the diagrams due to the correction processing of the present embodiment.

Figure 8:
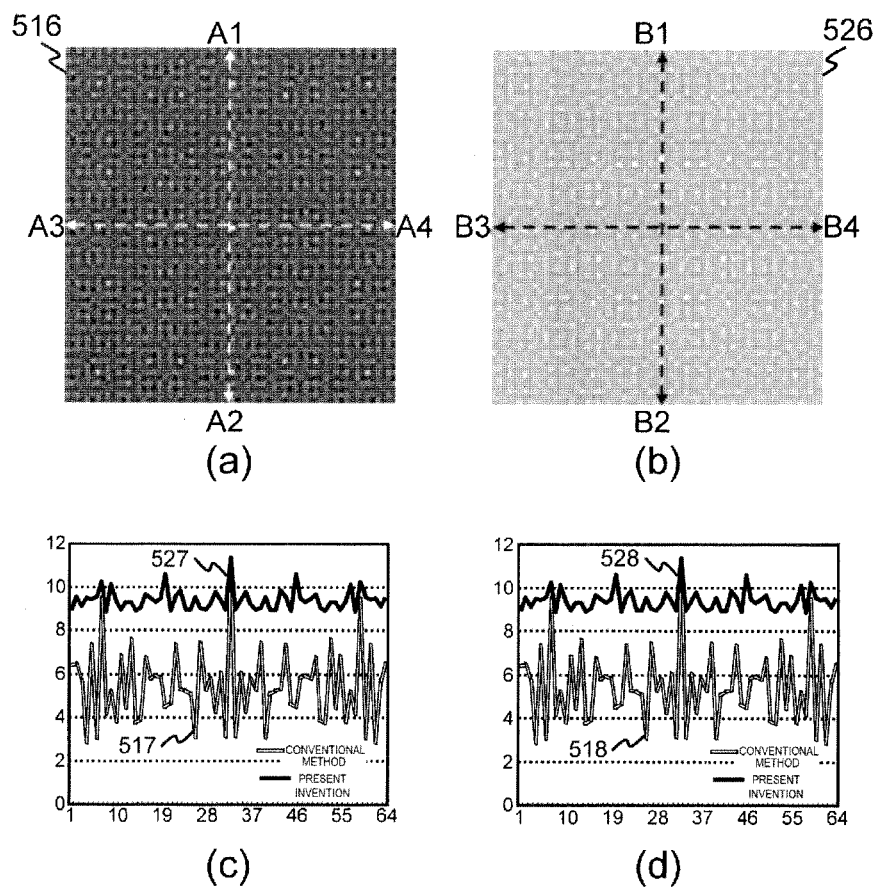
FIG. 8 is an explanatory view for explaining a comparison result between a conventional method and a method of the first embodiment, where

In addition, FIG. 8(a) shows a data density 516 of data (64×64 pixels) near the center of k-space data immediately before reconstructing a final image obtained by the conventional method, and FIG. 8(b) shows a data density 526 of data (64×64 pixels) near the center of k-space data immediately before reconstructing a final image obtained by performing the correction processing of the present embodiment. In addition, FIG. 8(c) is a profile 517 on the line segment connecting A1 and A2 of FIG. 8(a) and a profile 527 on the line segment connecting B1 and B2 of FIG. 8(b). In addition, FIG. 8(d) is a profile 518 on the line segment connecting A3 and A4 of FIG. 8(a) and a profile 528 on the line segment connecting B3 and B4 of FIG. 8(b). In FIGS. 8(c) and 8(d), the horizontal axis indicates a position in a pixel [pixel], and the vertical axis indicates a pixel value.

As can be seen from the aforementioned diagrams, the data density showing the non-uniform distribution in the conventional method has become uniform by performing the correction processing of the present embodiment. This is also understood from the point that the profiles 517, 527, 518, and 528 shown in FIGS. 8(c) and 8(d) become uniform since a fluctuation in the data density is suppressed by performing the correction processing of the present embodiment.

In addition, although the case where the multi-channel coil having two or more channels is used as the receiving coil 161 has been described as an example in the present embodiment, the number of channels may be 1. In this case, the multi-channel combination processing of step S1260 in FIG. 5 does not need to be performed. In addition, the combination unit 350 may not be provided.

As described above, the magnetic resonance imaging apparatus (MRI apparatus) 100 of the present embodiment includes: the measurement unit 310 that acquires unit k-space data by measuring an echo signal for each unit k-space by non-Cartesian measurement; the correction unit 320 that corrects the unit k-space data to acquire unit k-space data after correction; the rearrangement unit 330 that rearranges the unit k-space data after correction in Cartesian coordinate system k-space; and the imaging unit 340 that reconstructs an image by performing an inverse Fourier transform of data after rearrangement by the rearrangement unit 330. The correction unit 320 includes the unit imaging section 321 that reconstructs a unit image, which is an image of each unit k-space, from the unit k-space data, the field of view enlargement section 322 that enlarges a field of view of the unit image to acquire an enlarged image, and the unit signaling section 323 that performs a Fourier transform of the enlarged image to acquire unit k-space data after correction.

When the used receiving coil 161 is a multi-channel coil having a plurality of channels, the combination unit 350 that combines final images acquired for the respective channels is further provided. The measurement unit 310 acquires the unit k-space data by measuring the echo signal for each of the channels using the coil 151, the correction unit 320 acquires the unit k-space data after correction by correcting the unit k-space data for each of the channels, the rearrangement unit 330 rearranges the unit k-space data after correction for each of the channels, and the imaging unit 340 acquires the final image for each of the channels. Images combined by the combination unit 350 are final images of the respective channels.

That is, according to the present embodiment, in each unit measurement of the non-Cartesian measurement, the acquired unit k-space data is imaged by an inverse Fourier transform, and the field of view of the image is enlarged in a direction in which the data density is to be increased. Then, the image after the enlargement of the field of view is Fourier transformed, thereby acquiring unit k-space data after correction that has a small k-space pitch in a direction in which the field of view has been enlarged and has an increased amount of data. Then, a final image is reconstructed by gridding the unit k-space data after correction.

Therefore, according to the present embodiment, body movement artifacts can be reduced by using the non-Cartesian measurement. In addition, since the above-described correction processing is performed when reconstructing an image from the acquired k-space data, a difference between data densities in the respective encoding directions is reduced in each unit k-space. Accordingly, it is possible to reduce artifacts due to non-uniform data density.

Thus, according to the present embodiment, it is possible to improve image quality by reducing the artifacts due to non-uniform data density without compromising the advantages of non-Cartesian measurement.

In addition, in the correction processing of the present embodiment, a Fourier transform is performed twice when reconstructing the unit image 420 from an echo signal in the blade 410 before correction and when acquiring an echo signal in the corrected blade 440 from the reconstructed image 430 after the enlargement of the field of view (enlarged unit image). When the number of data to be processed is a power of 2, a fast Fourier transform (FFT) can be used as an algorithm of the Fourier transform. For example, there are a case where the number of phase encoding steps N in the blade 410 before correction is a power of 2, a case where the number of pixels of an image after the enlargement of the field of view in the phase encoding direction is a power of 2. However, the FFT cannot be used when a power of 2 is not satisfied.

In general, since the number of phase encoding steps defining the number of pieces of data to be processed of the present embodiment is determined from the contrast, imaging time, or the like of an image, the number of phase encoding steps is not necessarily a power of 2. In such a case, a discrete Fourier transform (DFT) is used as an algorithm of the Fourier transform.

However, the processing time of the DFT is longer than that of the FFT. In particular, since a forward and inverse Fourier transforms are repeated in each blade in the present embodiment, time for correction processing is increased if the DFT having long processing time is used as a Fourier transform.

Figure 9:
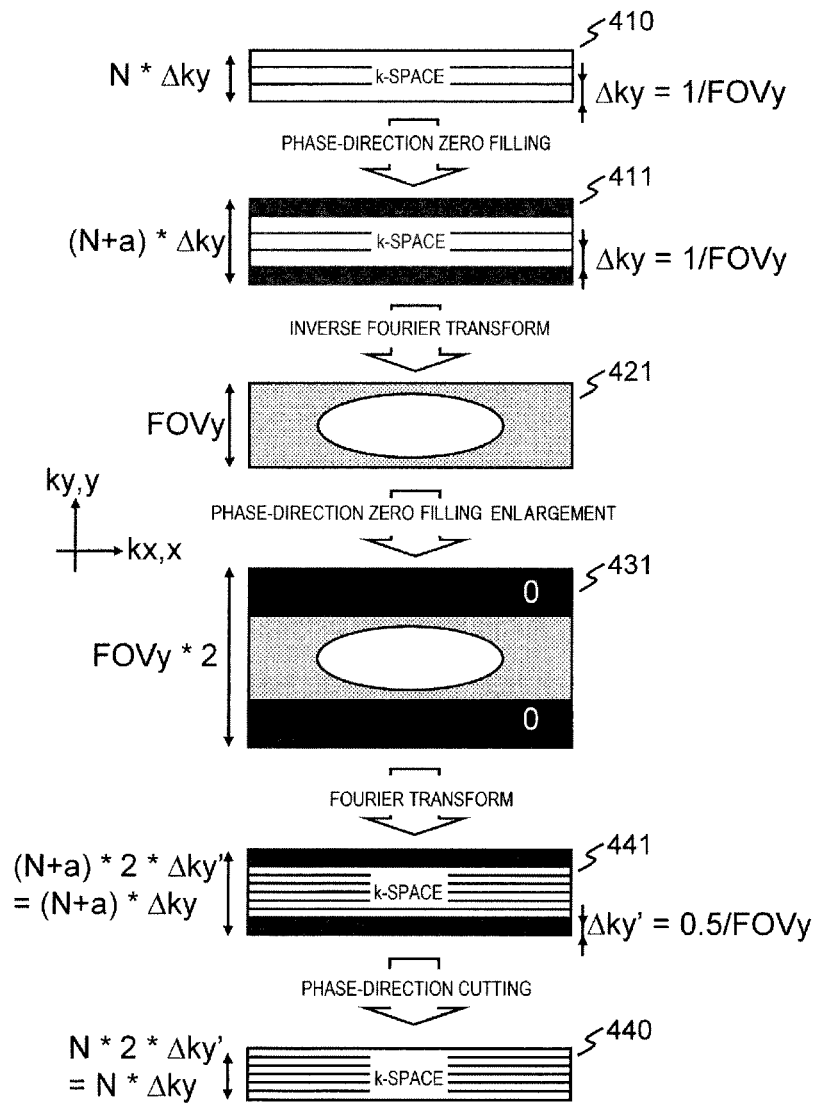
FIG. 9 is an explanatory view for explaining a modification of the correction processing of the first embodiment.

Hereinafter, a modification of correction processing in which the FFT can be applied as an inverse Fourier transform to acquire the unit image regardless of the number of phase encoding steps of each blade 410 will be described with reference to FIG. 9. Here, the number of phase encoding steps of the blade 410 before correction is set to N (N is an integer of 1 or more) in the same manner as described above.

First, the unit imaging section 321 sets the number of phase encoding steps of the blade 410 before correction in the phase encoding direction to a power of 2 before reconstructing the unit image by Fourier transform. Then, a blade 411 in which the number of phase encoding steps is a power of 2 is acquired. Here, the number of phase encoding steps is set to N+a (power of 2) by performing zero filling in the phase encoding direction by the number of encoding steps "a" in the phase encoding direction. Therefore, the blade 411 is called a zero filling blade 411. In addition, the number of encoding steps to be increased "a" is calculated by the following Expression (4).

[Expression 4]

$$a = 2^{ceil(log^2 N) + C} - N \quad (4)$$

Here, ceil( ) in Expression is an operator to make the value in parentheses become an integer by rounding off below the decimal point. In addition, C in Expression is a parameter defining the number of phase encoding steps after zero filling, and is set to an integer of 0 or more. In a normal case, C is 0, but 1 or more may also be used. By using the value of 1 or more, the periodicity of each zero filling blade 411 in the phase encoding direction can be increased. As a result, it is possible to improve the accuracy of the Fourier transform. In addition, when N is a power of 2, C may be set to 1 or more.

In addition, in this case, the pitch of the zero filling blade 411 in the phase encoding direction of k-space is Δky in the same manner as for the blade 410. On the other hand, the width in the short axis direction is (N+a)*Δky.

Then, the unit imaging section 321 images the zero filling blade 411 by two-dimensional inverse Fourier transform, thereby acquiring a unit image 421. In addition, the field of view of the unit image 421 in the y direction is FOVy.

Then, the field of view enlargement section 322 enlarges the field of view of the unit image 421 using the above-described method of the present embodiment, thereby acquiring an enlarged unit image 431. Here, in the same manner as the embodiment described above, assuming that the field of view magnification is 2, the field of view of the enlarged unit image 431 in the y direction is FOVy*2.

Then, the unit signaling section 323 performs a two-dimensional Fourier transform of the enlarged unit image 431, thereby acquiring a corrected zero filling blade 441 that is k-space data after correction. In the corrected zero filling blade 441, the number of phase encoding steps is increases from (N+a) to (N+a)*2. On the other hand, the k-space pitch in the phase encoding direction is reduced from Δky to Δky'. In addition, Δky' is defined by Expression (2) described above, and is Δky'=0.5/FOVy.

In addition, the unit signaling section 323 acquires the corrected blade 440, which is a unit k-space after correction, by removing a region, which corresponds to the number of encoding steps "a" added by the unit imaging section 321, from the corrected zero filling blade 441. Here, the corrected blade 440 is obtained by cutting a region, which corresponds to phase encoding of N*2, of the center of the corrected zero filling blade 441. The acquired corrected blade 440 is k-space data whose width in the short axis direction is N*2*Δky', that is, N*Δky. Accordingly, the acquired corrected blade 440 becomes k-space data whose width in the short axis direction is the same as the width of the blade 410 before correction in the short axis direction.

That is, in the magnetic resonance imaging apparatus (MRI apparatus) 100 of the present embodiment, the unit imaging section 321 performs zero filling for the unit k-space data so that the number of pieces of data to be processed becomes a power of 2 and then reconstructs the unit image from the unit k-space data after zero filling, and the unit signaling section 323 performs a Fourier transform of the enlarged image and then removes a portion of zero filling, which has been performed for the unit k-space data by the unit imaging section, to acquire unit k-space data after correction.

Thus, the FFT can be used as an inverse Fourier transform by adding zero filling processing of the blade to set the number of pieces of data to be processed to a power of 2. Therefore, since it is possible to increase the speed of the reconstruction of a unit image from a unit blade, it is possible to reduce the time of the entire imaging processing.

<<Second Embodiment>>

Next, a second embodiment of the present invention will be described. In the present embodiment, parallel imaging is used. The parallel imaging method is a technique of receiving echo signals in parallel by a plurality of receiving coils and performing processing using the sensitivity distribution of each receiving coil. In the parallel imaging method, the imaging speed is increased by thinning out and collecting echo signals.

Figure 10:
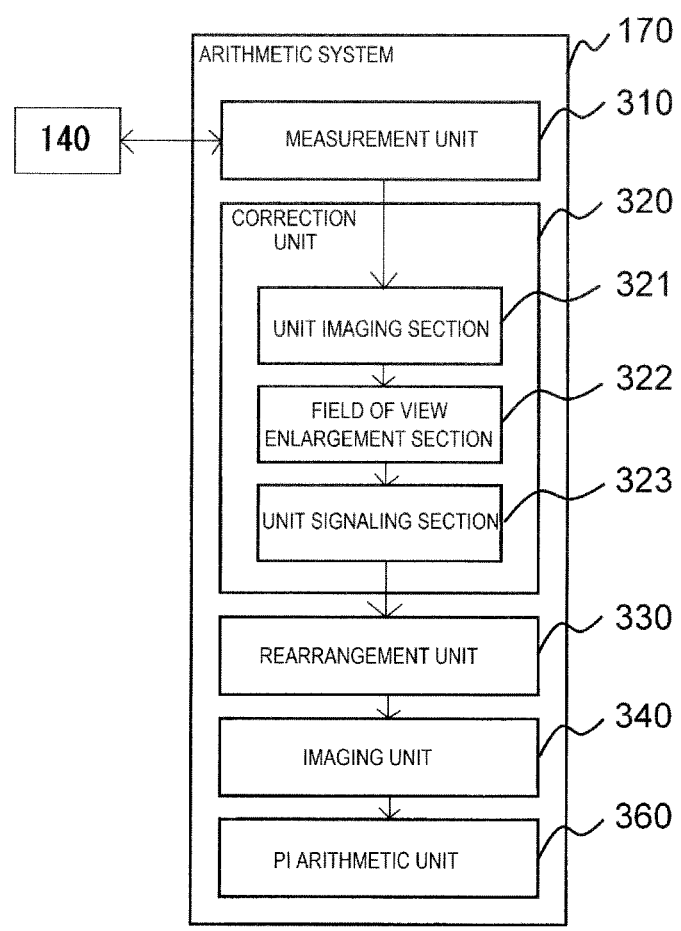
FIG. 10 is a functional block diagram of an arithmetic system of a second embodiment.

The MRI apparatus of the present embodiment has basically the same configuration as the MRI apparatus 100 of the first embodiment. In addition, each function realized by the arithmetic system 170 of the present embodiment is also basically the same. In the present embodiment, however, the receiving coil 161 includes a plurality of unit coils (channels) in order to perform parallel imaging. In addition, as shown in FIG. 10, the arithmetic system 170 of the present embodiment includes a parallel arithmetic unit (PI arithmetic unit) 360 that performs parallel imaging operation in addition to each component included in the first embodiment. In addition, the measurement unit 310 of the present embodiment performs measurement for parallel imaging. On the other hand, since images of respective channels are combined in the parallel imaging operation, the arithmetic system 170 of the present embodiment does not include the combination unit 350.

Hereinafter, the present embodiment will be described focusing on the different configuration from the first embodiment. Upon explanation, as in the first embodiment, a case is exemplified in which an imaging sequence, in which the hybrid radial method and the FSE method are combined, is used for non-Cartesian measurement.

The measurement unit 310 of the present embodiment performs measurement according to the same imaging sequence as in the first embodiment, but echo signals are thinned out in each blade and are measured. The thinning rate is set in advance.

The PI arithmetic unit 360 of the present embodiment performs a parallel imaging operation in the image of each blade reconstructed by the unit imaging section 321. That is, in the present embodiment, folds caused in the unit image are expanded using the sensitivity distribution. In addition, when parallel imaging applied to each blade is a self-calibration type, each sensitivity distribution is calculated from the measured blade data. Alternatively, the measured blade data is gridded once, and the sensitivity distribution is calculated from data obtained by extracting only the k-space center region.

In the case of self-calibration type parallel imaging, the measurement unit 310 acquires blade data so that the k-space center portion is dense and the other portions are sparse.

Since the k-space center portion acquired densely expresses the sensitivity distribution of each channel, the PI arithmetic unit 360 calculates the sensitivity distribution used in the computation of parallel imaging by extracting the data of this region. In addition, this processing is omitted when parallel imaging to be applied is not the self-calibration type.

Figure 11:
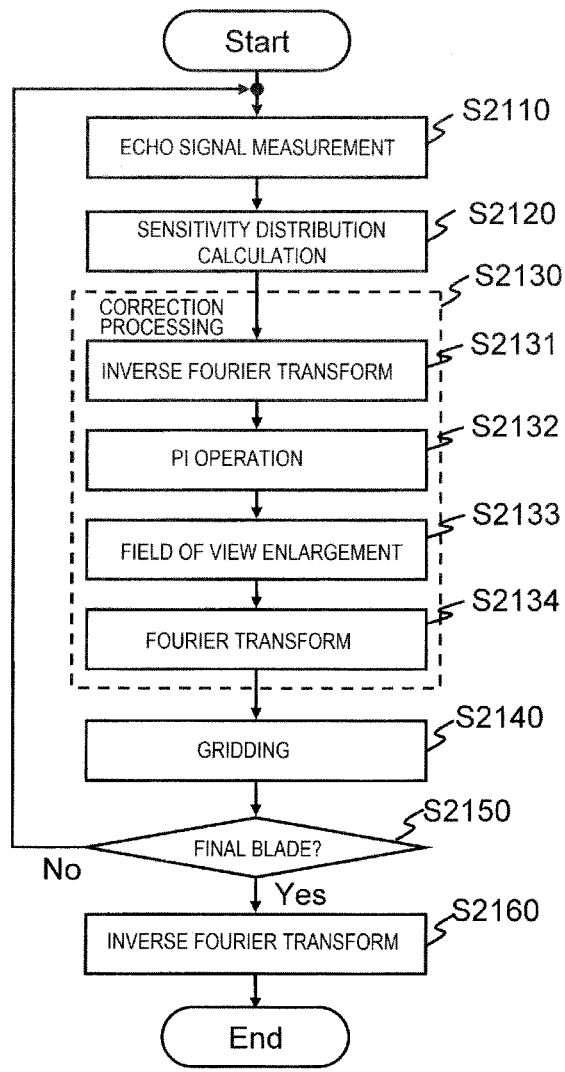
FIG. 11 is a flow chart of imaging processing of the second embodiment.

Hereinafter, the flow of imaging processing of the arithmetic system 170 of the present embodiment will be described with reference to FIG. 11.

Here, a case where the self-calibration type parallel imaging is used will be described as an example.

The outline of the imaging processing of the present embodiment is basically the same as that of the first embodiment. That is, the measurement unit 310 measures an echo signal first (step S2110), thereby acquiring unit k-space data of each channel. In this case, in the present embodiment, echo signals are thinned out and measured using the parallel imaging method. Then, the PI arithmetic unit 360 calculates the sensitivity distribution from the measurement result (step S2120).

Then, in the present embodiment, the correction unit 320 performs correction processing for correcting the unit k-space data (step S2130).

In the correction processing of the present embodiment, first, the unit imaging section 321 performs a two-dimensional inverse Fourier transform of the unit k-space data (blade) of each channel (step S2131), thereby acquiring a unit image of each channel.

Then, the PI arithmetic unit 360 performs a parallel imaging operation on the acquired unit image of each channel (step S2132). As a result, folds are expanded, and an expanded unit image in which images of respective channels are combined is acquired.

The field of view enlargement section 322 enlarges the field of view of the expanded unit image using the same method as in the first embodiment (step S2133), thereby acquiring an enlarged unit image. In this case, a value set in advance is used as the field of view magnification.

Then, the unit signaling section 323 performs a two-dimensional Fourier transform of the enlarged unit image using the same method as in the first embodiment (step S2134), thereby acquiring a corrected blade that is unit k-space data after correction.

After the correction processing is completed by the above procedure, the rearrangement unit 330 performs gridding processing on the corrected blade (S2140), and the arithmetic system 170 performs the process of steps S2110 to S2140 for all blades (step S2150). Then, the imaging unit 340 performs a two-dimensional inverse Fourier transform for all pieces of the acquired k-space data (step S2160), thereby reconstructing an image (final image).

As described above, the magnetic resonance imaging apparatus (MRI apparatus) 100 of the present embodiment includes: the measurement unit 310 that acquires unit k-space data by measuring an echo signal for each unit k-space by non-Cartesian measurement; the correction unit 320 that corrects the unit k-space data to acquire unit k-space data after correction; the rearrangement unit 330 that rearranges the unit k-space data after correction in Cartesian coordinate system k-space; and the imaging unit 340 that reconstructs an image by performing an inverse Fourier transform of data after rearrangement by the rearrangement unit 330. The correction unit 320 includes the unit imaging section 321 that reconstructs a unit image, which is an image of each unit k-space, from the unit k-space data, the field of view enlargement section 322 that enlarges a field of view of the unit image to acquire an enlarged image, and the unit signaling section 323 that performs a Fourier transform of the enlarged image to acquire unit k-space data after correction.

In addition, the parallel arithmetic unit 360, which performs a parallel imaging operation to expand folds using sensitivity distribution, is further provided, and the measurement unit 310 thins out measurements of echo signals in the non-Cartesian measurement. In addition, the parallel arithmetic unit 360 expands the folds of the unit image to acquire an expanded unit image, and the field of view enlargement section 322 uses the expanded unit image as the unit image.

That is, according to the present embodiment, in each unit measurement of the non-Cartesian measurement that is thinning-out measurement, the acquired unit k-space data is interpolated and is then imaged by an inverse Fourier transform, and the field of view of the image is enlarged in a direction in which the data density is to be increased. Then, the image after the enlargement of the field of view is Fourier transformed, thereby acquiring unit k-space data after correction having a small k-space pitch in a direction in which the field of view has been enlarged and having an increased amount of data. Then, a final image is reconstructed by gridding the unit k-space data after correction.

Therefore, according to the present embodiment, body movement artifacts can be reduced by using the non-Cartesian measurement. In addition, since the above-described correction processing is performed in the same manner as in the first embodiment, a difference between data densities in the respective encoding directions is reduced in each unit k-space. Accordingly, it is possible to reduce artifacts due to non-uniform data density. In addition, according to the present embodiment, since the parallel imaging method in which thinning-out measurement is performed is used, it is possible to reduce the measurement time while minimizing the degradation of image quality.

In addition, according to the present embodiment, multi-channel combination is performed in units of a blade in the parallel imaging operation. When multi-channel combination is performed in a final image, it is necessary to perform gridding processing on all pieces of k-space data of the number of channels in order to acquire final images of the number of channels.

The gridding processing requires a large amount of computation. Accordingly, if the number of multi-channel coils is large, time required for processing becomes long. However, according to the present embodiment, multi-channel combination is performed for each unit k-space (blade). That is, since the multi-channel combination is performed before the gridding processing, the gridding processing may be performed on only one entire k-space data. Therefore, since the amount of computation is small, the processing time is reduced.

Therefore, according to the present embodiment, it is possible to improve image quality and reduce the total imaging time without compromising the characteristics of the non-Cartesian measurement.

In addition, although the expansion processing of parallel imaging is performed on an image in the present embodiment, the present invention is not limited thereto. For example, it is also possible to use k-space parallel imaging for performing expansion processing in k-space data.

Figure 12:
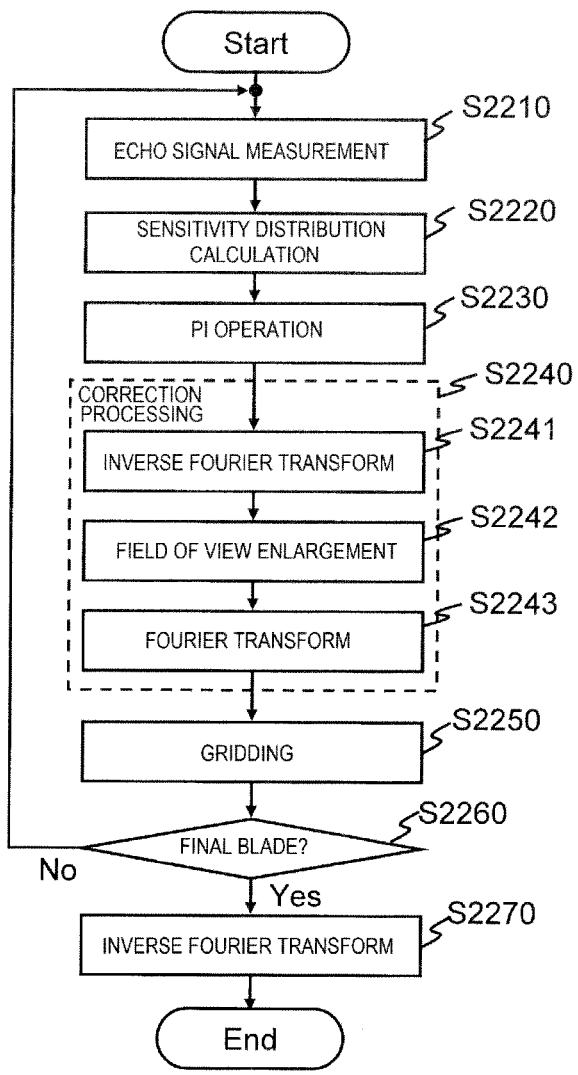
FIG. 12 is a flow chart of a modification of the imaging processing of the second embodiment.

The flow of imaging processing by each unit of the arithmetic system 170 when k-space parallel imaging is used will be described with reference to FIG. 12. FIG. 12 is a process flow of imaging processing when the k-space parallel imaging is used. A case where the self-calibration type is used will also be described as an example herein.

First, the measurement unit 310 thins out measurements of echo signals in each blade (step S2210), thereby acquiring unit k-space data of each channel. In this case, the measurement unit 310 thins out measurements of echo signals using a parallel imaging method as in the present embodiment. Then, the PI arithmetic unit 360 calculates the sensitivity distribution from the measurement result (step S2220). Then, the PI arithmetic unit 360 calculates thinned-out encoding position data of the measured blade by a parallel imaging operation using the calculated sensitivity distribution (step S2230). Here, the combination of unit k-space data of each channel is also performed. Then, the PI arithmetic unit 360 acquires interpolated unit k-space data.

The correction unit 320 performs correction processing on the interpolated unit k-space data that is data of a blade after parallel imaging processing (step S2240). As the correction processing, first, the unit imaging section 321 performs a two-dimensional inverse Fourier transform of the interpolated unit k-space data to image the interpolated unit k-space data (step S2241), thereby acquiring a unit image. Then, the field of view enlargement section 322 enlarges the field of view of the unit image using the same method as in the first embodiment (step S2242), thereby acquiring an enlarged unit image. Then, the unit signaling section 323 performs a two-dimensional Fourier transform of the enlarged unit image using the same method as in the first embodiment (step S2243), thereby acquiring unit k-space data after correction that is a corrected blade.

After the correction processing is completed by the above procedure, the rearrangement unit 330 performs gridding processing on the unit k-space data after correction (step S2250). The arithmetic system 170 performs the process of steps S2210 to S2250 for all blades (step S2260). Then, the imaging unit 340 performs a two-dimensional inverse Fourier transform for all pieces of the acquired k-space data (step S2270), thereby reconstructing a final image.

That is, when k-space parallel imaging is used, in the magnetic resonance imaging apparatus (MRI apparatus) 100 of the present embodiment, the parallel arithmetic unit 360 interpolates the unit k-space data to acquire interpolated unit k-space data, and the unit imaging section 321 reconstructs the unit image from the interpolated unit k-space data.

In addition, in this k-space parallel imaging operation, unit k-space data of each channel may not be combined. In this case, the arithmetic system 170 includes the combination unit 350, and the combination unit 350 combines the image of each channel after the inverse Fourier transform in step S2241.

<<Third Embodiment>>

Next, a third embodiment of the present invention will be described. In the first embodiment, a final image is acquired for each channel and finally multi-channel combination is performed. On the other hand, in the present embodiment, multi-channel combination is performed for each unit image reconstructed from unit k-space.

The MRI apparatus of the present embodiment has basically the same configuration as the MRI apparatus 100 of the first embodiment. In addition, each unit provided in the arithmetic system 170 of the present embodiment is the same as that in the first embodiment. However, since the timing at which multi-channel combination is performed is different, the flow of imaging processing is different.

Hereinafter, the present embodiment will be described focusing on the different configuration from the first embodiment. Also in the present embodiment, as in the first embodiment, a case will be described in which the imaging sequence 210, in which the hybrid radial method and the FSE method are combined, is used for non-Cartesian measurement.

In addition, in the present embodiment, the receiving coil 161 is assumed to be a multi-channel coil having two or more channels.

Figure 13:
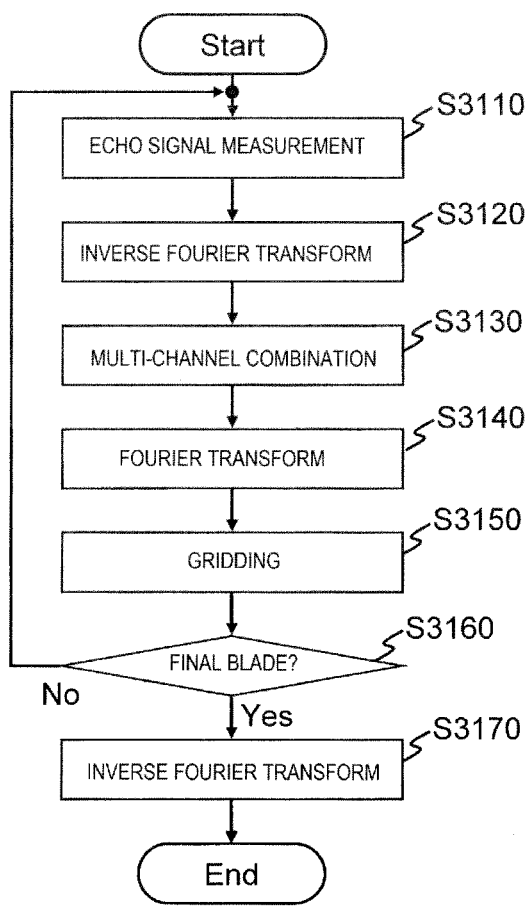
FIG. 13 is a flow chart of imaging processing which is conventional non-Cartesian measurement and in which multi-channel combination is performed for each blade.

Prior to the explanation of the flow of imaging processing of the present embodiment, the flow of imaging processing in which multi-channel combination is performed for each image reconstructed from each blade, which is conventional imaging processing in which the correction processing of the present embodiment is not performed, will be described. FIG. 13 is a process flow of the conventional imaging processing.

First, using the imaging sequence 210, an echo signal of one unit k-space (blade) is measured for each channel (step S3110). Then, a two-dimensional inverse Fourier transform of unit k-space data of each channel is performed (step S3120), thereby acquiring a unit image of each channel. Then, multi-channel combination of the unit image of each channel is performed (step S3130).

A Fourier transform of the unit image after multi-channel combination is performed (step S3140), thereby recovering the k-space data. Then, gridding processing is performed according to the blade rotation angle (step S3150). The process of steps S3110 to S3150 is performed for all blades (step S3160), and a two-dimensional inverse Fourier transform of all pieces of the acquired k-space data is performed (step S3170), thereby acquiring a final image.

Figure 14:
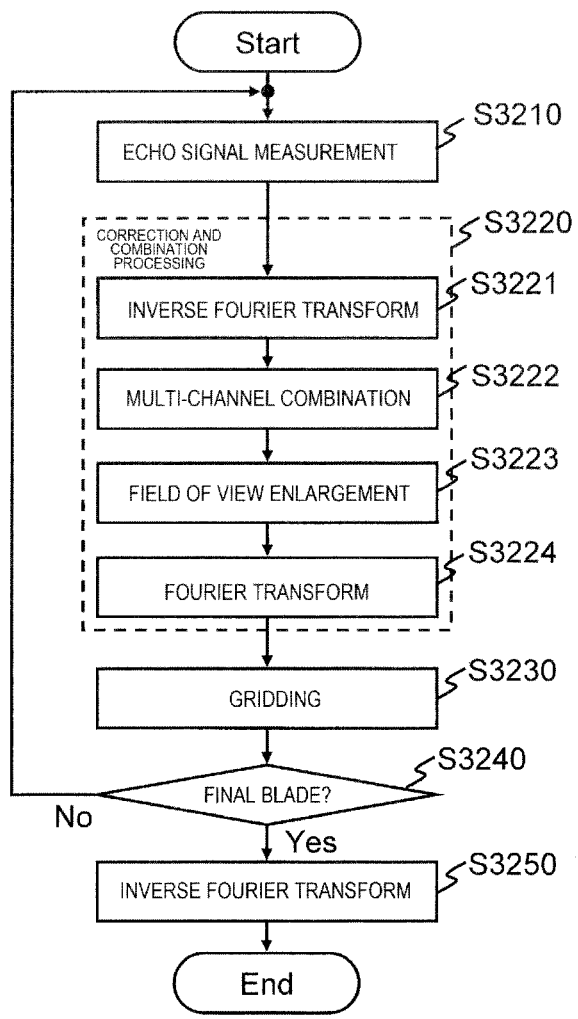
FIG. 14 is a flow chart of imaging processing of a third embodiment.

Next, the flow of imaging processing by each unit of the arithmetic system 170 of the present embodiment will be described with reference to FIG. 14. FIG. 14 is a process flow of the imaging processing of the present embodiment.

First, the measurement unit 310 measures an echo signal of one unit k-space (blade) for each channel according to the imaging sequence 210 that is non-Cartesian measurement (step S3210), and the acquired echo signal is disposed in k-space according to the blade rotation angle. Thus, in the present embodiment, the unit k-space data of each channel is acquired.

Then, in the present embodiment, the correction unit 320 performs correction processing for correcting the unit k-space data of each channel, and the combination unit 350 performs multi-channel combination of unit images (correction and combination processing: step S3220). As a result, corrected unit k-space data after multi-channel combination is acquired.

In step S3220, first, the unit imaging section 321 performs a two-dimensional inverse Fourier transform of the unit k-space data of each channel to image the unit k-space data of each channel (step S3221), thereby acquiring a unit image of each channel.

Then, the combination unit 350 performs multi-channel combination of the unit image of each channel (step S3222), thereby acquiring a composite unit image. The multi-channel combination may be any of absolute value combination and complex combination. In addition, in the case of complex combination, phase correction for each piece of channel data may be included.

Then, the field of view enlargement section 322 enlarges the field of view of the composite unit image using the same method as in the first embodiment (step S3223), thereby acquiring a composite unit image after the enlargement of the field of view (enlarged composite unit image).

The unit signaling section 323 performs a two-dimensional Fourier transform of the enlarged composite unit image (step S3224), thereby acquiring composite unit k-space data after correction in which k-space data of each channel is combined.

After the correction processing is completed by the above steps and composite unit k-space data after correction is acquired, the rearrangement unit 330 performs gridding processing on the composite unit k-space data after correction (S3230). The arithmetic system 170 performs the process of steps S3210 to S3230 for all blades (step S3240), thereby acquiring all pieces of composite k-space data after gridding processing. Then, the imaging unit 340 performs a two-dimensional inverse Fourier transform for all pieces of the acquired composite k-space data (step S3250), thereby reconstructing an image (final image). The final image acquired herein is a composite image of all channels.

Thus, in the present embodiment, the field of view enlargement processing of the field of view enlargement section 322 is added to the imaging processing of the conventional non-Cartesian measurement shown in FIG. 13.

Hereinafter, in order to show the effect of the correction processing of the present embodiment, a comparison between a final image obtained by imaging processing based on the conventional method shown in FIG. 13 and a final image obtained by imaging processing including the correction processing of the present embodiment shown in FIG. 14 is shown in FIG. 15.

FIG. 15(a) is a final image 611 obtained by the conventional method, FIG. 15(b) is a final image 621 obtained by performing the correction processing of the present embodiment, FIG. 15(c) is an image 613 obtained by enlarging a central portion (frame) 612 of FIG. 15(a), FIG. 15(d) is an image 623 obtained by enlarging a central portion (frame) 622 of FIG. 15(b), and FIG. 15(e) is a brightness profile 614 on the line segment connecting C1 and C2 of FIG. 15(c) and a brightness profile 624 on the line segment connecting D1 and D2 of FIG. 15(d). In addition, FIG. 15(f) is a brightness profile 615 on the line segment connecting C3 and C4 of FIG. 15(c) and a brightness profile 625 on the line segment connecting D3 and D4 of FIG. 15(d).

As can be seen from the aforementioned diagrams, artifacts are caused in the final images 611 and 613 obtained by the conventional method, but the artifacts have disappeared due to the correction processing of the present embodiment. In particular, in the brightness profiles 614, 624, 615, and 625 shown in FIGS. 15(e) and 15(f), it can be seen that especially artifacts are reduced and the brightness profiles are smooth at positions indicated by arrows 631, 632, and 633 in the diagrams due to the correction processing of the present embodiment.

As can be seen from the aforementioned diagrams, the data density showing the non-uniform distribution in the conventional method has become uniform by performing the correction processing of the present embodiment.

As described above, the magnetic resonance imaging apparatus (MRI apparatus) 100 of the present embodiment includes: the measurement unit 310 that acquires unit k-space data by measuring an echo signal for each unit k-space by non-Cartesian measurement; the correction unit 320 that corrects the unit k-space data to acquire unit k-space data after correction; the rearrangement unit 330 that rearranges the unit k-space data after correction in Cartesian coordinate system k-space; and the imaging unit 340 that reconstructs an image by performing an inverse Fourier transform of data after rearrangement by the rearrangement unit 330. The correction unit 320 includes the unit imaging section 321 that reconstructs a unit image, which is an image of each unit k-space, from the unit k-space data, the field of view enlargement section 322 that enlarges a field of view of the unit image to acquire an enlarged image, and the unit signaling section 323 that performs a Fourier transform of the enlarged image to acquire unit k-space data after correction.

In addition, when the receiving coil 161 is a multi-channel coil, the combination unit 350 that combines an image obtained for each channel is further provided. The measurement unit 310 acquires the unit k-space data by measuring the echo signal for each channel using the receiving coil having a plurality of channels, the unit imaging section 321 reconstructs the unit image for each channel, the combination unit 350 combines the unit image of each channel to acquire a composite unit image, and the field of view enlargement section 322 uses the composite unit image as the unit image.

That is, according to the present embodiment, as in the first embodiment, in each unit measurement of the non-Cartesian measurement, the acquired unit k-space data is imaged by an inverse Fourier transform and multi-channel combination of the resulting image is performed, and then the field of view of the image is enlarged in a direction in which the data density is to be increased. Then, the image after the enlargement of the field of view is Fourier transformed, thereby acquiring unit k-space data after correction which has a small k-space pitch in a direction in which the field of view has been enlarged and has an increased amount of data. Then, a final image is reconstructed by gridding the unit k-space data after correction.

Therefore, as in the first embodiment, body movement artifacts can be reduced by using the non-Cartesian measurement. In addition, since the above-described correction processing is performed, a difference between data densities in the respective encoding directions is reduced in each unit k-space. Accordingly, it is possible to reduce artifacts due to non-uniform data density. In addition, according to the present embodiment, multi-channel combination is performed for each unit image in the correction processing. As described in the second embodiment, since the gridding processing having a large amount of computation is performed on only one entire k-space data, the processing time is reduced.

Therefore, according to the present embodiment, it is possible to improve image quality and reduce the processing time without compromising the characteristics of the non-Cartesian measurement.

In addition, in each of the embodiments described above, the measurement of the measurement unit 310 may be half measurement. As the half measurement, there are a half echo measurement method of measuring only about half of the data of each blade in a frequency encoding direction and a half scan measurement method of measuring only about half of the data of each blade in a phase encoding direction. In the present embodiment, either or both of the aforementioned methods may be applied.

When the half measurement is used, an image is reconstructed by estimating non-measurement data from the acquired measurement data of about the half. In each of the embodiments described above, this estimation processing is performed at the timing before the correction processing. That is, the estimation processing is performed between steps S1210 and S1220 in the first embodiment, between steps S2110 and S2120 and/or between steps S2210 and S2220 in the second embodiment, and between steps S3110 and S3120 in the third embodiment.

In addition, although the case where the hybrid radial method is used for the non-Cartesian measurement has been described as an example in each of the above embodiments, the non-Cartesian measurement method that is used is not limited thereto. In the present embodiment, imaging is performed for each blade (unit k-space). Therefore, phase encoding is required in unit k-space. In addition, non-uniformity of the data density in the overlapping region of a blade (unit k-space) is eliminated by increasing the number of pieces of data in the blade, thereby obtaining the uniform data density. Therefore, unit k-spaces need to overlap each other.

Other non-Cartesian measurement methods may also be used as long as the methods satisfy the conditions in which there is phase encoding in unit k-space and unit k-spaces overlap each other. Examples of other non-Cartesian measurement methods that satisfy the aforementioned conditions include a multi-shot spiral scan, measurement using each blade having a fan shape, and the like.

When the aforementioned measurement methods are used, data of each unit k-space equivalent to a blade in the above-described hybrid radial method is created from the acquired echo signal, and the above-described correction processing is performed on each piece of the created data. That is, a unit image is created by performing a Fourier transform. In this case, gridding is performed when necessary. Then, each of the embodiments described above is applied to the unit image, and the field of view is enlarged in a direction, in which the data density is to be increased, by zero filling or the like. By performing a Fourier transform of the unit image whose field of view has been enlarged as described above, unit k-space data after correction, which has a small k-space pitch and has an increased amount of data, is acquired. By gridding all pieces of the unit k-space data after correction to reconstruct an image, an image without artifacts due to non-uniform data density is acquired.

In addition, although the gridding is performed for each blade after correction in each of the embodiments described above, the gridding processing is not limited to this procedure. The gridding may also be performed after correcting all blades. That is, the gridding may be performed for each corrected blade between the above-described steps S1240 and S1250 in the process flow of FIG. 5, between steps S2150 and S2160 in the process flow of FIG. 11, between steps S2260 and S2270 in the process flow of FIG. 12, and between steps S3240 and S3250 in the process flow of FIG. 14.

In addition, although the two-dimensional measurement has been described as an example in each of the above embodiments, the present invention can also be applied to three-dimensional measurement.

In addition, each function realized by the arithmetic system 170 in each of the embodiments described above does not necessarily need to be realized by the arithmetic system 170 included in the MRI apparatus 100. Each function realized by the arithmetic system 170 in each of the embodiments described above may also be realized by an information processing apparatus that is provided separately from the MRI apparatus 100 and that can transmit and receive data to and from the MRI apparatus 100.

REFERENCE SIGNS LIST

100: MRI apparatus
101: object
120: static magnetic field generation system
130: gradient magnetic field generation system
131: gradient magnetic field coil
132: gradient magnetic field power source
140: sequencer
150: high frequency magnetic field generation system
151: transmission coil
152: synthesizer
153: modulator
154: high frequency amplifier
160: high frequency magnetic field detection system
161: receiving coil
162: signal amplifier
163: quadrature phase detector
164: A/D converter
170: arithmetic system
171: CPU
172: storage device
173: external storage device
174: display device
175: input device
210: imaging sequence
211: excitation RF pulse
212: refocusing RF pulse
213: gradient magnetic field pulse
215: echo signal
220: blade
310: measurement unit
320: correction unit
321: unit imaging section
322: field of view enlargement section
323: unit signaling section
330: rearrangement unit
340: imaging unit
350: combination unit
360: PI arithmetic unit
410: blade
411: zero filling blade
420: unit image
421: unit image
430: enlarged unit image
431: enlarged unit image
440: corrected blade
441: zero filling blade
511: final image
512: frame
513: enlarged image
514: brightness profile
515: brightness profile
516: data density
517: profile
518: profile
521: final image
522: frame
523: enlarged image
524: brightness profile
525: brightness profile
526: data density
527: profile
528: profile
531: arrow
532: arrow
533: arrow
611: final image
612: frame
613: enlarged image
614: brightness profile
615: brightness profile
621: final image
622: frame
623: enlarged image
624: brightness profile 625: brightness profile
631: arrow
632: arrow
633: arrow

The invention claimed is:

1. A magnetic resonance imaging apparatus, comprising:
a measurement unit that acquires unit k-space data by measuring an echo signal for each unit k-space by non-Cartesian measurement;
a correction unit that corrects the unit k-space data to acquire unit k-space data after correction;
a rearrangement unit that rearranges the unit k-space data after correction in Cartesian coordinate system k-space; and
an imaging unit that reconstructs an image by performing an inverse Fourier transform of data after rearrangement by the rearrangement unit,
wherein the correction unit includes a unit imaging section that reconstructs a unit image, which is an image of each unit k-space, from the unit k-space data, a field of view enlargement section that enlarges a field of view of the unit image to acquire an enlarged image, and a unit signaling section that performs a Fourier transform of the enlarged image to acquire unit k-space data after correction.

2. The magnetic resonance imaging apparatus according to claim 1,
wherein the field of view enlargement section acquires the enlarged image by performing zero filling in a phase direction of the unit image.

3. The magnetic resonance imaging apparatus according to claim 1, further comprising:
a receiving coil having a plurality of channels; and
a combination unit that combines final images obtained for the respective channels.

4. The magnetic resonance imaging apparatus according to claim 3,
wherein the measurement unit acquires the unit k-space data by measuring the echo signal for each of the channels using the receiving coil,
the correction unit acquires the unit k-space data after correction by correcting the unit k-space data for each of the channels,
the rearrangement unit rearranges the unit k-space data after correction for each of the channels,
the imaging unit acquires the final image for each of the channels, and
the combination unit combines the final images of the respective channels.

5. The magnetic resonance imaging apparatus according to claim 3,
wherein the measurement unit acquires the unit k-space data by measuring the echo signal for each of the channels using the receiving coil,
the unit imaging section rearranges the unit image from the unit k-space data for each of the channels,
the combination unit acquires a composite unit image by combining the unit images of the respective channels, and
the field of view enlargement section uses the composite unit image as the unit image.

6. The magnetic resonance imaging apparatus according to claim 1, further comprising:
a parallel arithmetic unit that performs a parallel imaging operation to expand folds using sensitivity distribution,
wherein the measurement unit thins out measurements of the echo signals in the non-Cartesian measurement.

7. The magnetic resonance imaging apparatus according to claim 6,
wherein the parallel arithmetic unit acquires an expanded unit mage by expanding folds of the unit image, and
the field of view enlargement section uses the expanded unit image as a unit image to enlarge the field of view.

8. The magnetic resonance imaging apparatus according to claim 6,
wherein the parallel arithmetic unit acquires interpolated unit k-space data by interpolating the unit k-space data, and
the unit imaging section reconstructs the unit image from the interpolated unit k-space data.

9. The magnetic resonance imaging apparatus according to claim 8, further comprising:
a combination unit that combines the unit image to acquire a composite unit image,
wherein the field of view enlargement section uses the composite unit image as a unit image to enlarge the field of view.

10. The magnetic resonance imaging apparatus according to claim 1,
wherein the unit imaging section performs zero filling for the unit k-space data so that the number of pieces of data to be processed becomes a power of 2 and then reconstructs the unit image from unit k-space data after the zero filling, and
the unit signaling section acquires the unit k-space data after correction by performing a Fourier transform of the enlarged image and then performing a process of removing the zero filling performed for the unit k-space data by the unit imaging section.

11. The magnetic resonance imaging apparatus according to claim 1,
wherein the measurement unit performs the measurement using half measurement.

12. The magnetic resonance imaging apparatus according to claim 1,
wherein the non-Cartesian measurement is a measurement using a hybrid radial method in which measurement is performed by dividing k-space where the echo signal is disposed into a plurality of unit k-spaces that are unit k-spaces having measurement trajectories passing through an origin of the k-space and that have different rotation angles, which are angles of the measurement trajectories with respect to a coordinate axis of the k-space.

13. The magnetic resonance imaging apparatus according to claim 1,
wherein the field of view enlargement section performs zero filling of pixels for a field of view enlarged with a magnification set in advance.

14. A magnetic resonance imaging method, comprising:
a signal measurement step of acquiring unit k-space data by measuring an echo signal for each unit k-space by non-Cartesian measurement;
a unit image reconstruction step of reconstructing a unit image, which is an image of each unit k-space, from the unit k-space data;
a field of view enlargement step of enlarging a field of view of the unit image to acquire an enlarged image;
a unit signaling step of performing a Fourier transform of the enlarged image to acquire unit k-space data after correction;
a signal rearrangement step of rearranging the unit k-space data after correction in Cartesian coordinate system k-space; and a final imaging step of reconstructing an image by performing an inverse Fourier transform of data after rearrangement in the signal rearrangement step.

15. The magnetic resonance imaging method according to claim 14,
wherein, in the signal measurement step, echo signals are thinned out and measured for each unit k-space to acquire the unit k-space data,
a parallel arithmetic step of acquiring an expanded unit image by expanding folds of the unit image is included, and
in the field of view enlargement step, the enlarged image is acquired by enlarging a field of view of the expanded unit image.

16. The magnetic resonance imaging method according to claim 14,
wherein, in the signal measurement step, echo signals are thinned out and measured for each unit k-space to acquire the unit k-space data,
a parallel arithmetic step of acquiring interpolated unit k-space data by interpolating the unit k-space data is included, and
in the unit image reconstruction step, the unit image is reconstructed from the interpolated unit k-space data.

17. The magnetic resonance imaging method according to claim 14,
wherein, in the signal measurement step, unit k-space data is acquired for each channel,
in the unit image reconstruction step, the unit image of each channel is reconstructed from the unit k-space data of each channel,
an image combination step of acquiring a composite unit image by combining the unit image of each channel is included, and
in the field of view enlargement step, the enlarged image is acquired by enlarging a field of view of the composite unit image.

* * * * *